US008164103B2

(12) United States Patent
Chen

(10) Patent No.: US 8,164,103 B2
(45) Date of Patent: Apr. 24, 2012

(54) MULTIPLE CIRCUIT POWER SUPPLY INTERFACE FOR LIGHT-EMITTING-DIODE COLOR MIXING

(76) Inventor: Shih-Chien Chen, Taipei (TW)

( * ) Notice: Subject to any disclaimer, the term of this patent is extended or adjusted under 35 U.S.C. 154(b) by 199 days.

(21) Appl. No.: 12/632,450

(22) Filed: Dec. 7, 2009

(65) Prior Publication Data

US 2010/0181579 A1 Jul. 22, 2010

(30) Foreign Application Priority Data

Jan. 17, 2009 (TW) ................................ 98200888 U

(51) Int. Cl.
*H01L 29/26* (2006.01)

(52) U.S. Cl. .............. 257/89; 257/79; 257/99; 257/691; 257/E27.12

(58) Field of Classification Search .................... 257/89, 257/E27.12, 79
See application file for complete search history.

(56) References Cited

U.S. PATENT DOCUMENTS

2007/0167054 A1* 7/2007 Wu ................................ 439/238
2007/0242485 A1* 10/2007 Chien ............................ 362/643
2008/0266856 A1* 10/2008 Chien ............................ 362/249
2009/0027903 A1* 1/2009 Yu ................................ 362/378
2009/0175042 A1* 7/2009 Chien ...................... 362/311.02
2009/0251923 A1* 10/2009 Yu ................................ 362/653

* cited by examiner

*Primary Examiner* — Thanh Nguyen
(74) *Attorney, Agent, or Firm* — Leong C. Lei

(57) ABSTRACT

The present invention discloses an light emitting diode (LED) light source and an interface for providing power to the LED. The LED light source includes an LED unit and a second coupling unit. The LED unit includes a base, one or more LED, and a first coupling unit. The LED are attached to the base. The joining of the first and second coupling units provides a mechanical support and electricity to the LED. The LED, are connected with independent circuit loops and controlled by controller to change the brightness of the LED. This structure allows the second coupling unit to be applied to any luminaries or replacement of a traditional light source, thus making the LED unit a universal LED light source for mass production and cost reduction. With the use of various types of LED and electric current control, modulation of brightness, color, and color temperature may be achieved.

3 Claims, 10 Drawing Sheets

MULTIPLE CIRCUIT POWER SUPPLY INTERFACE FOR LIGHT-EMITTING-DIODE COLOR MIXING

BACKGROUND OF THE INVENTION a) Field of the Invention

The present invention relates to a lighting structure, and more particularly to an assembly of a light-emitting-diode (LED) light source and a power supply interface, allowing an LED light source to be freely applied to all kinds of luminaries or to substitute for any traditional light sources, featuring an easy plug-in action.

b) Description of the Prior Art

With the advantages of having a high energy efficiency, long lifespan, durability, saving electricity, being eco-friendly and having a small volume, LED has become a new light source of great potential of various applications in recent years. In early days of its development, as the LED does not have sufficient luminance, its application is limited to pilot lights or display panels. However, due to recent breakthrough in the material science and the packaging technology, the luminance of the LED has significantly improved to the point that LED can replace traditional general lighting sources, such as an incandescent lamp, halogen lamp or fluorescent lamp.

Furthermore, LED emitting various wavelengths of light have been developed. In addition to the most common red light LED in the early days, there are now blue light, green light, white light and ultraviolet LED. There are also vendors who have developed a multiple-colored LED, in which red, green, and blue epitaxies are present simultaneously. As any color perceived by human eyes is formed by quantitative mixture of three primary colors of red, green and blue, any light color can be created by combining the LED of three primary colors and adjusting the electric current of each LED, including the white light at any color temperature. All these developments will enhance the potential of the LED in general lighting.

Nevertheless, when using the LED for the general lighting, following problems and shortcomings still exist:

1. The production costs of the LED light source are still higher than those of the traditional light sources. Mass production of the LED light source of the same specification must be achieved before the unit cost can be reduced.

2. Currently, one of the main approaches of using LED for general lighting is to replace the traditional light sources (the incandescent lamp, the halogen lamp or the fluorescent lamp), requiring the design of LED light sources to mimic the traditional sources to be replaced, in shape, size and power supply interface. This approach has the advantage of ready access to the market share currently occupied by the traditional light sources. The disadvantages may include difficult heat dissipation, spatial interference, increased cost, and not being able to access to other markets.

3. The other common approach of using the LED in general lighting is to build the LED directly into a complete luminary. This approach prevents the luminary end user from accessing the LED itself, therefore the light source cannot be easily replaced. This approach also prohibits downstream luminary manufacturers and designers, who lack the engineering capabilities, from integrating the LED directly into their products. This situation contradicts the need to manufacture LED in large quantities to reduce cost.

SUMMARY OF THE INVENTION

The primary objective of the present invention is to provide an assembly of a LED light source and a power supply interface, allowing the LED light source to be freely applied to all kinds of luminaries or to substitute any traditional light sources, while featuring a plug-in action so that this LED light source may be easily replaced by end users.

To achieve the aforementioned objective, the assembly of LED light source and a power supply interface of the present invention includes an LED light source unit and a second coupling unit, wherein the LED light source unit contains a base, one or more LED and a first coupling unit. Each LED is fixed on the base and is electrically connected, separately in groups or individually, with an electricity connection assembly. The first coupling unit and the base are assembled integrally and the first coupling unit is electrically connected with the electricity connection assembly. The second coupling unit corresponds to the first coupling unit and allows for insertion of the first coupling unit. The second coupling unit is electrically connected to the first coupling unit and provides a power source to the LED.

Because the second coupling unit may be easily deployed in multiple numbers and in any configurations to fit the needs of creating luminaries or replacement for traditional light sources, the LED light source and a power supply interface of the present invention may be used by any luminary designer and manufacturer. The end user of the luminaries may replace the LED light source of different nature or when dysfunction occurs. These easy-to-adapt feature of the present invention will allow mass production to achieve cost reduction.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
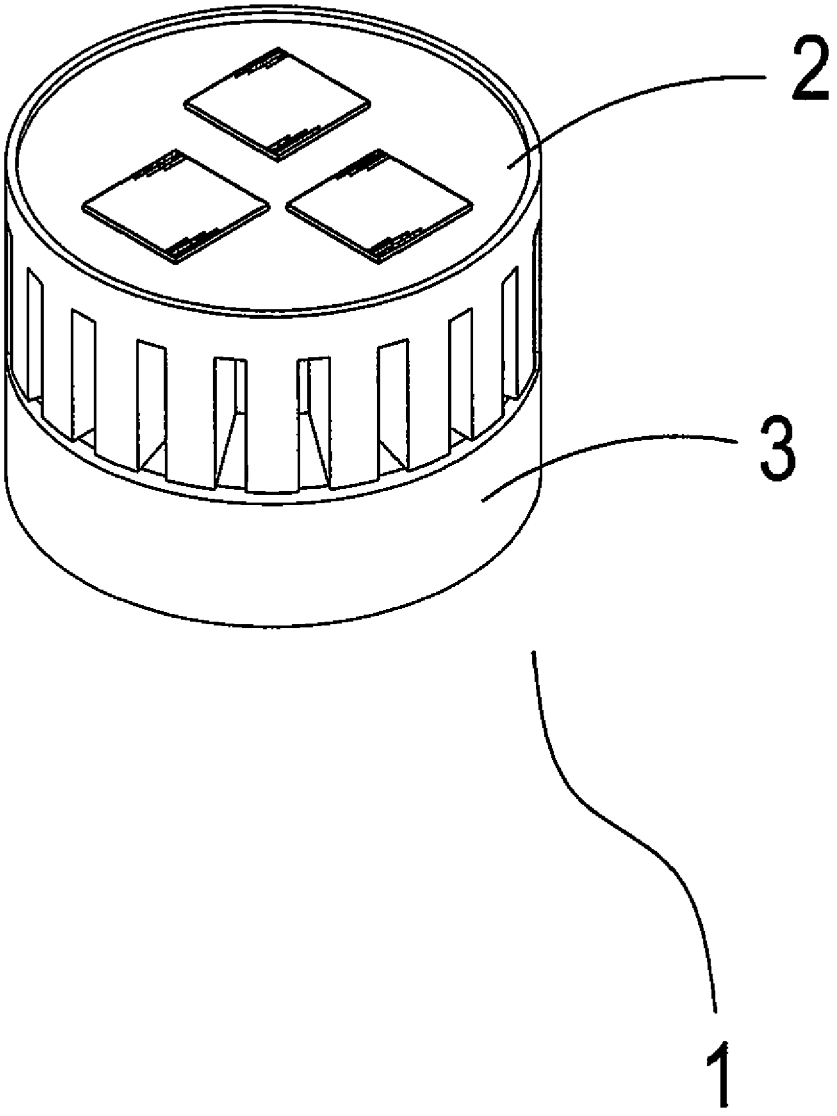
FIG. 1 shows a three-dimensional view of a preferred embodiment of the present invention.

FIGS. 1, 2, 2A and 3 show a three-dimensional view, a first exploded view, a second exploded view and a block diagram, of a preferred embodiment of the present invention, respectively. As shown in the drawings, an LED assembly 1 of the present invention comprises an LED unit 2 and a second coupling unit 3. The LED unit 2 includes a base 21, which can be configured as a heat dissipation device, and one or more LED 22, which are fixed on the base 21 and are connected with an electricity connection assembly 23 (an electric wire in the drawings or a circuit), and a first coupling unit 24. Each LED 22 can be provided with an independent circuit loop and can be connected in any combination of parallel or series circuit to one another. Furthermore, each LED 22 can be a red light LED 22, a green light LED 22, a blue light LED 22, a white light LED 22, a multiple-colored LED 22, or any kind of LED.

The first coupling unit 24 and the base 21 are assembled integrally, and the first coupling unit 24 is electrically connected with the electricity connection assembly 23. In addition, the first coupling unit 24 can be configured as a male end of the coupling as shown in the drawings, or a female end of the coupling.

The second coupling unit 3 is provided corresponding to the first coupling unit 24 and allows for insertion of the first coupling unit 24. The second coupling unit 3 can be configured as a female end of the coupling as shown in the drawings, or a male end of the coupling. Moreover, the second coupling unit 3 provides electrical connection to the first coupling unit 2 and hence to the LED 22 and is electrically connected with at least one controller 31 to control an electric current of each LED 22 in groups or individually. The electric current of each LED 22 can thus be controlled by the controller 31 to adjust brightness and color of the LED 22 and the overall LED light source.

Figure 3:
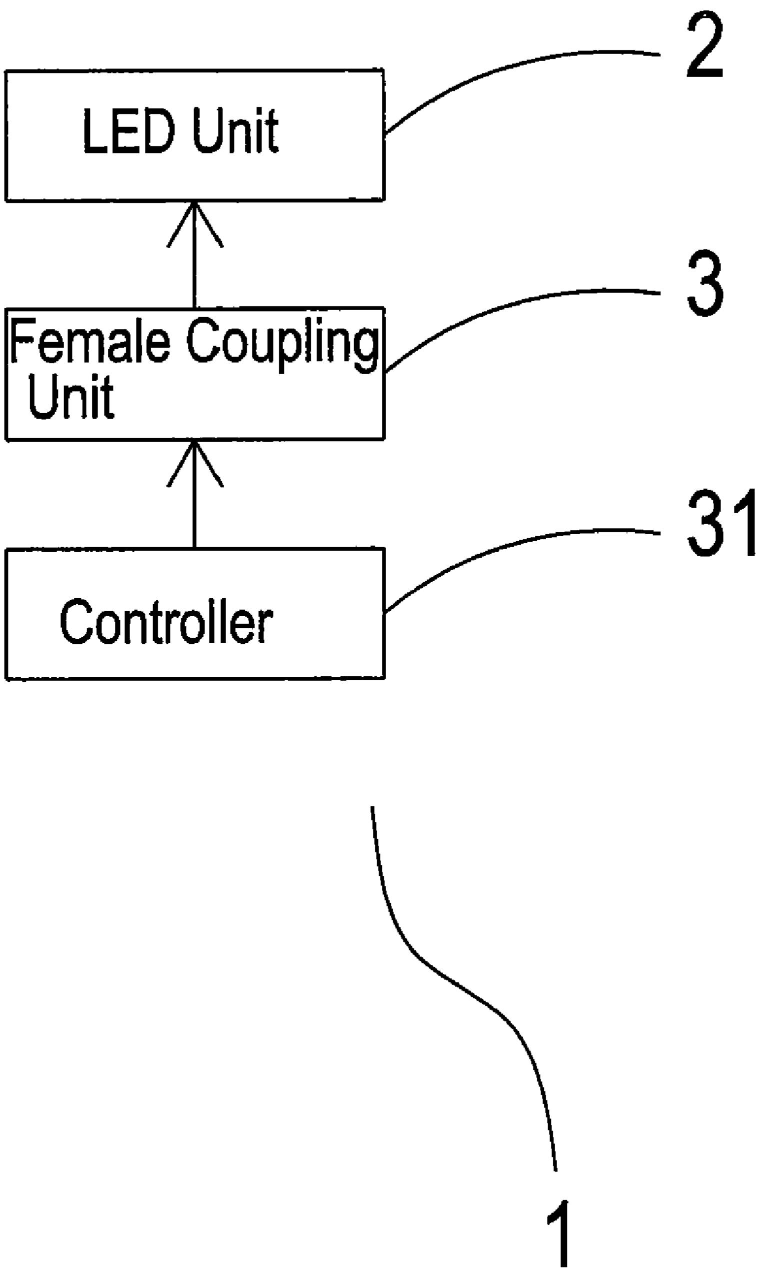
FIG. 3 shows a block diagram of the preferred embodiment of the present invention.

Furthermore, as shown in FIG. 3, a user can use the controller 31 to control the brightness and color of the LED light source.

Figure 2:
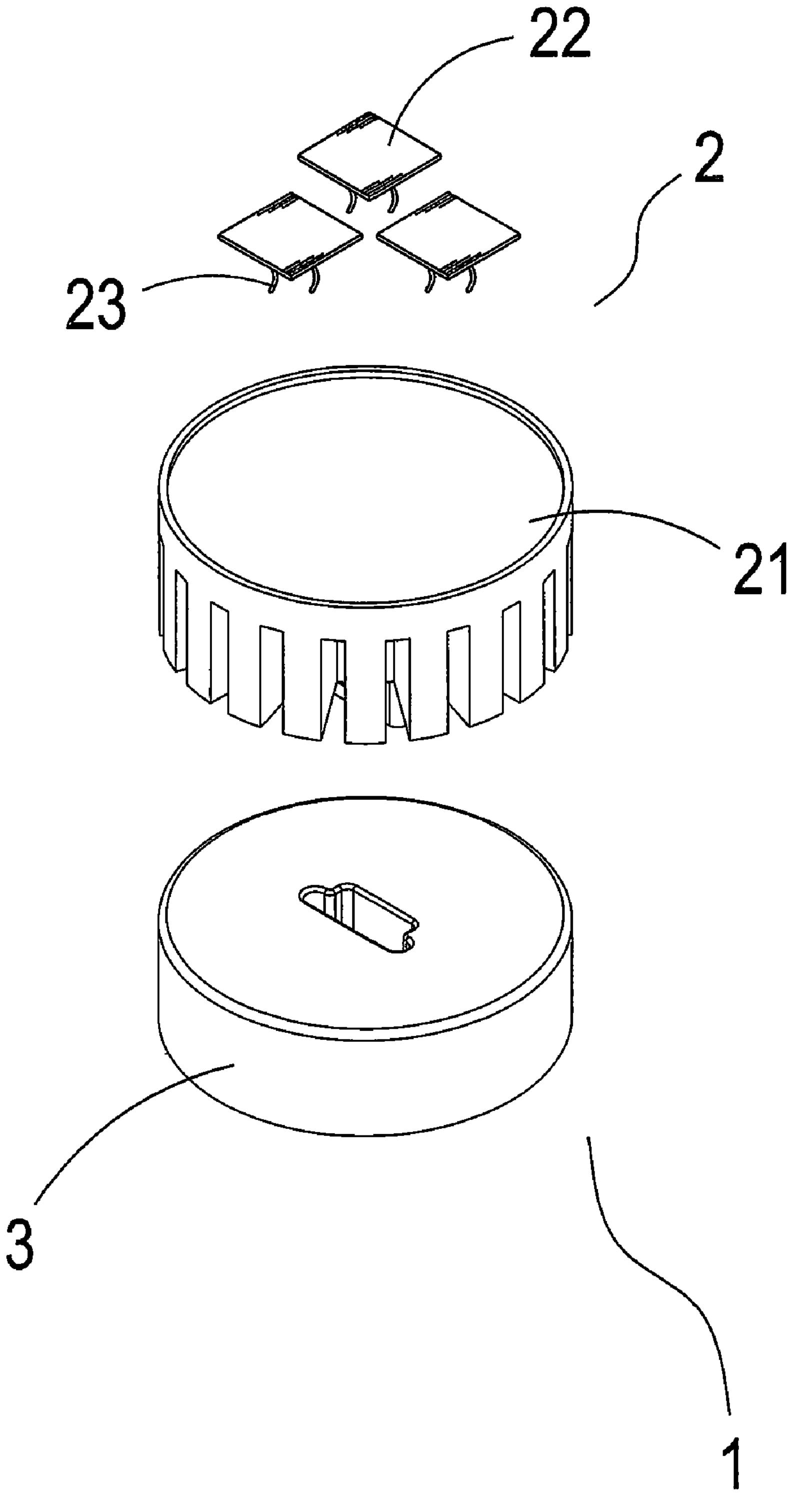
FIG. 2 shows a first exploded view of the preferred embodiment of the present invention.
Figure 2A:
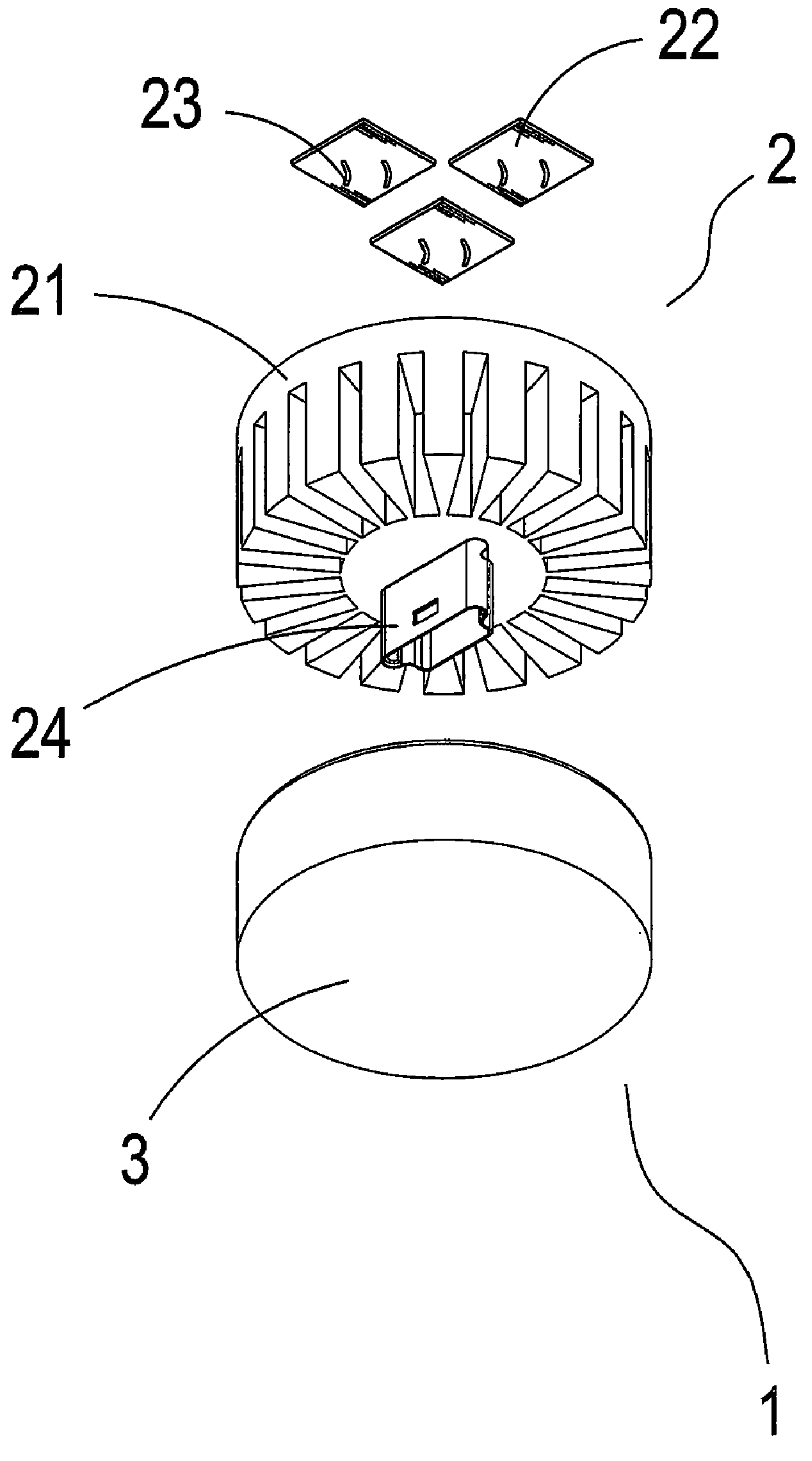
FIG. 2A shows a second exploded view of the preferred embodiment of the present invention.
Figure 4:
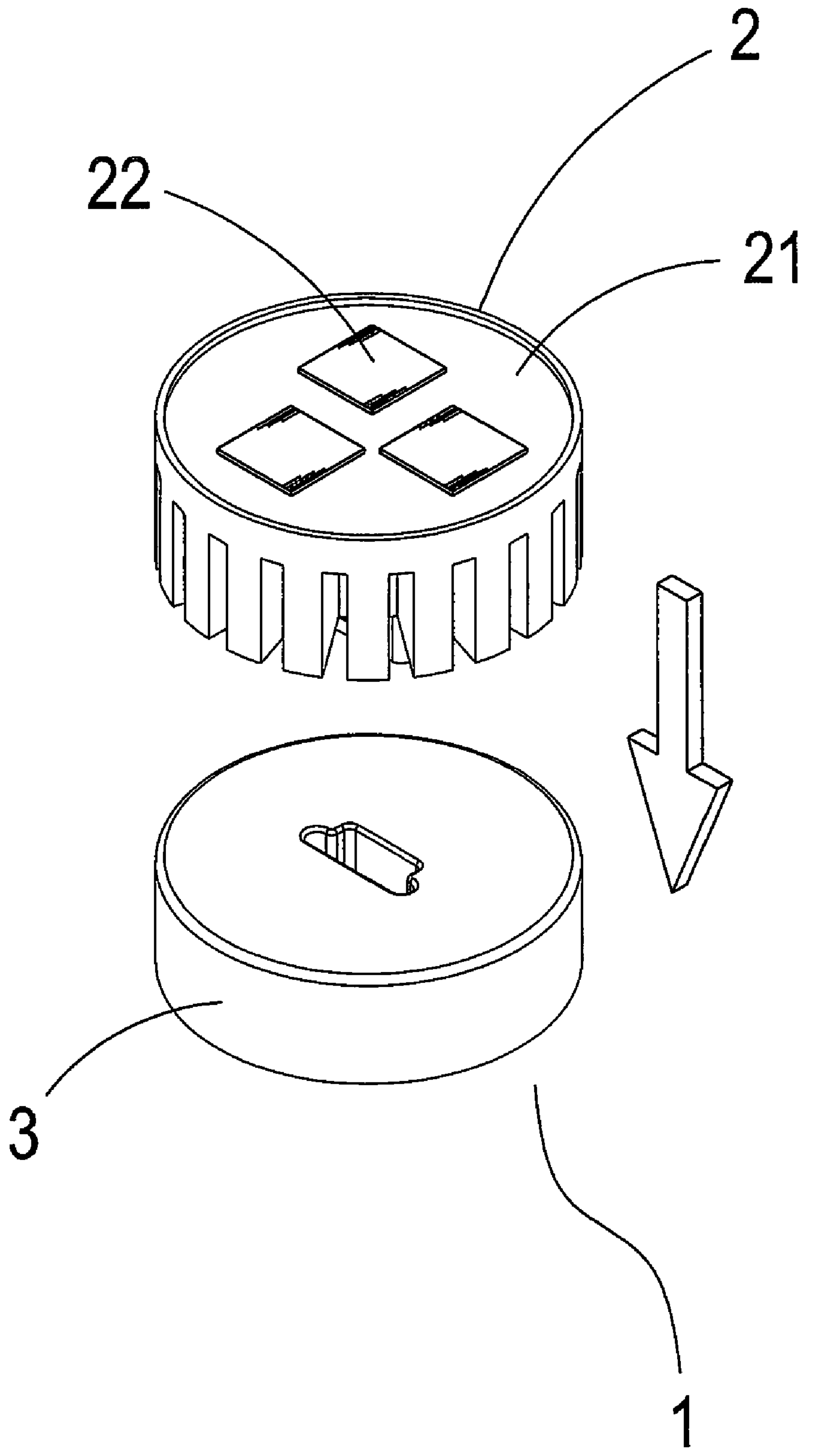
FIG. 4 shows a first schematic view of an operation of the preferred embodiment of the present invention.
Figure 5:
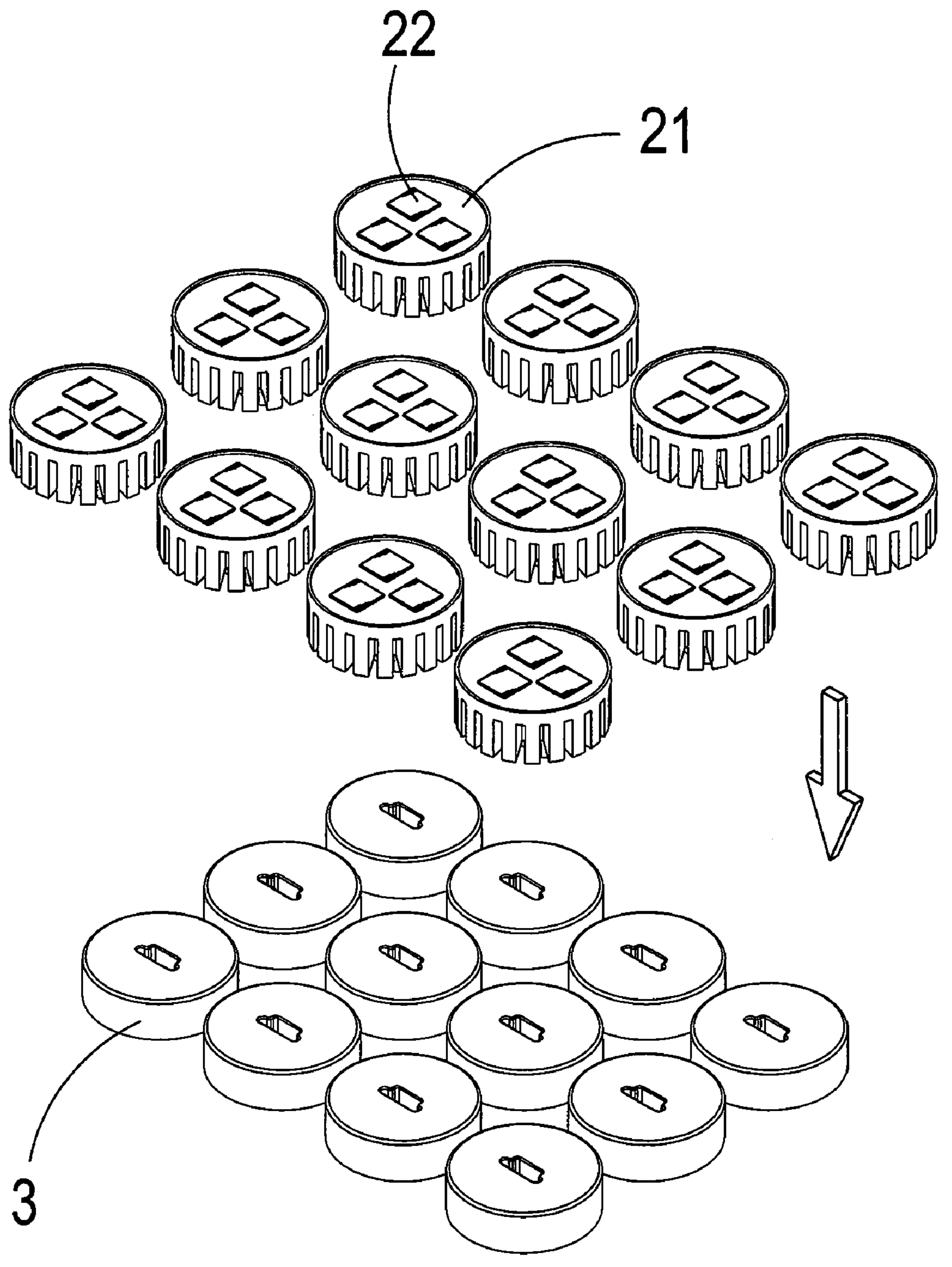
FIG. 5 shows a second schematic view of the operation of the preferred embodiment of the present invention.

FIGS. 2A, 4 and 5 show a second exploded view, a first schematic view of an operation, and a second schematic view of an operation, respectively, of the preferred embodiment of the present invention. As shown in FIG. 4, when the LED assembly 1 of the present invention is to be used, the first coupling unit 24 of the LED unit 2 is inserted into the second coupling unit 3, thereby accomplishing the electrical connection and mechanical support. As the second coupling unit 3 can provide electricity to each LED 22, when the LED unit 2 is inserted into the second coupling unit 3, each LED 22 will illuminate, achieving an effect of plug and illumination.

Furthermore, as shown in FIG. 5, more than one second coupling unit 3 of the present invention can be configured as an array of any configuration, the end user can freely insert the LED unit 2 into the second coupling unit 3 to enhance lighting at a specific location, increase the LED unit 2 to increase brightness or decrease the LED unit 2 to reduce the brightness, at will.

Figure 6:
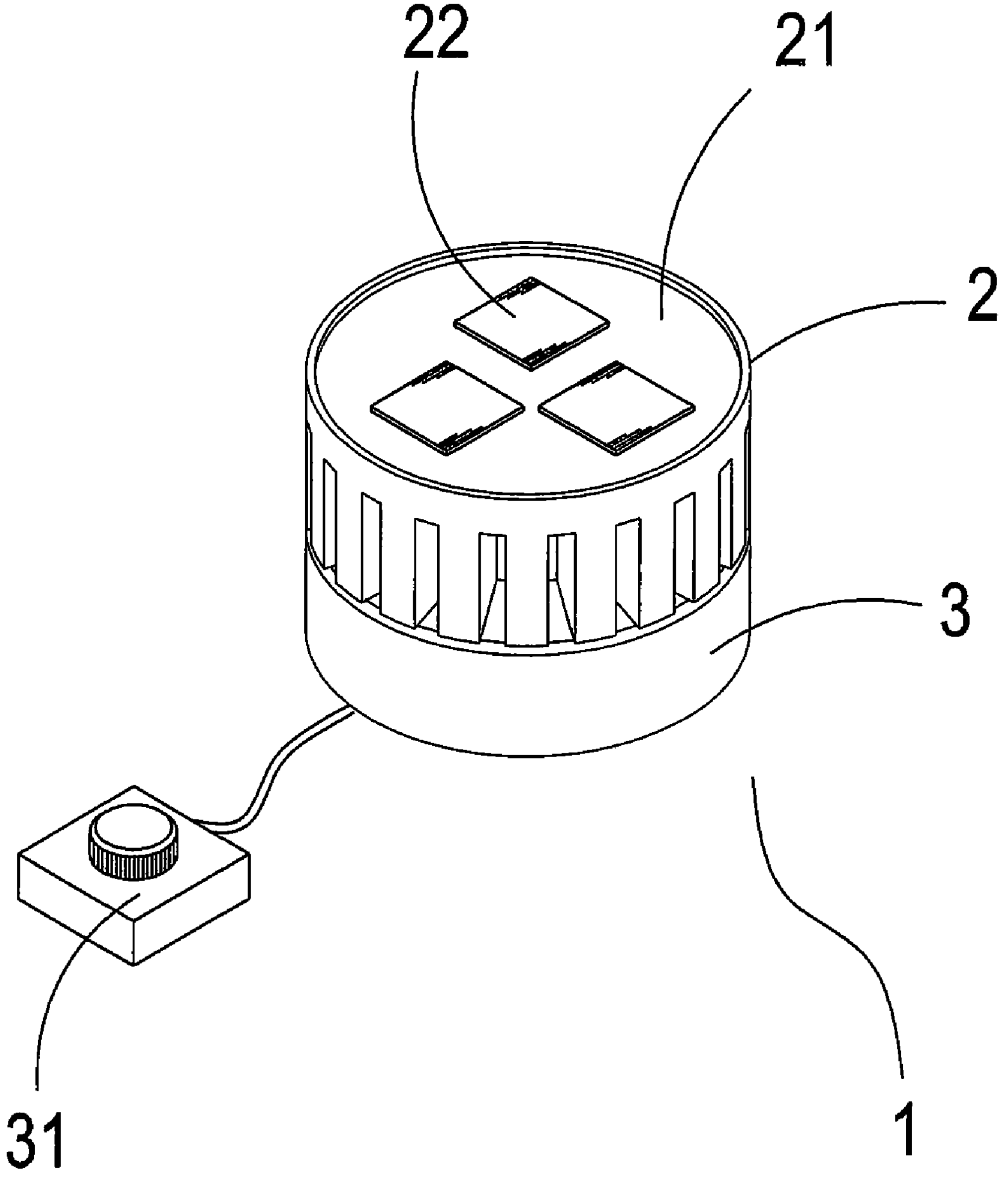
FIG. 6 shows a third schematic view of the operation of the preferred embodiment of the present invention.

FIG. 6 shows a third schematic view of an operation of the preferred embodiment of the present invention. As shown in the drawing, the second coupling unit 3 of the LED assembly 1 is electrically connected with the controller 31 which is adjustable by the end user, and the controller 31 is able to control the electric current of each LED 22 in groups or individually to adjust the brightness and color of each LED light source. While the LED 22 of the present invention can be any combination of red light LED 22, green light LED 22, blue light LED 22, white light LED 22, or ultraviolet LED and the LED 22, in groups or individually, is provided with an independent circuit loop, the user can use the controller 31 to freely adjust the currents of the LED groups or LED, achieving all kinds of color changes by freely mixing light sources using three primary colors of light. On the other hand, if the LED 22 is the multiple-colored LED 22, then pins of the multiple-colored LED 22 can be provided with a different power to control the color change of the multiple-colored LED 22.

Figure 7:
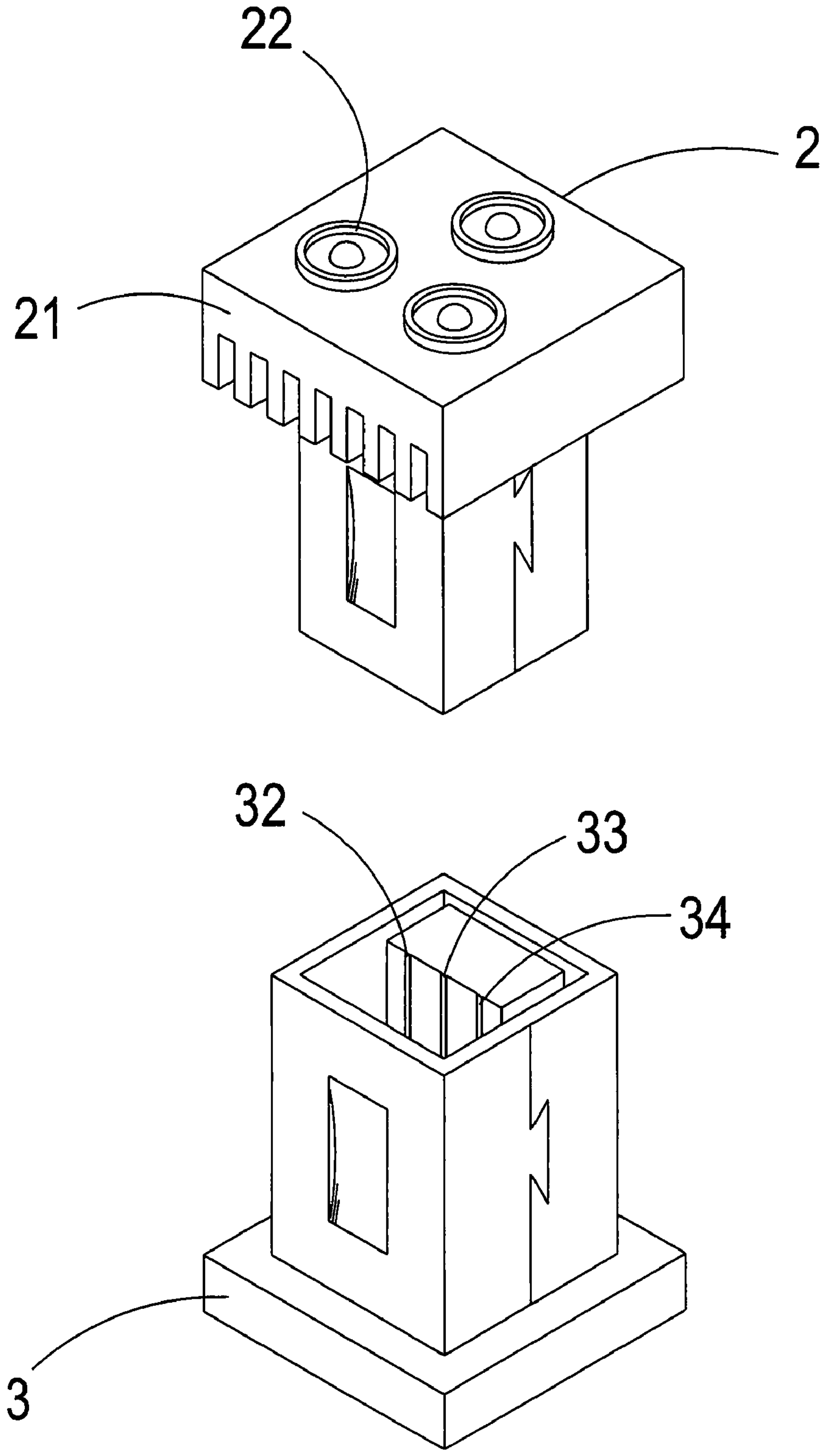
FIG. 7 shows a first exploded view of another preferred embodiment of the present invention.
Figure 7A:
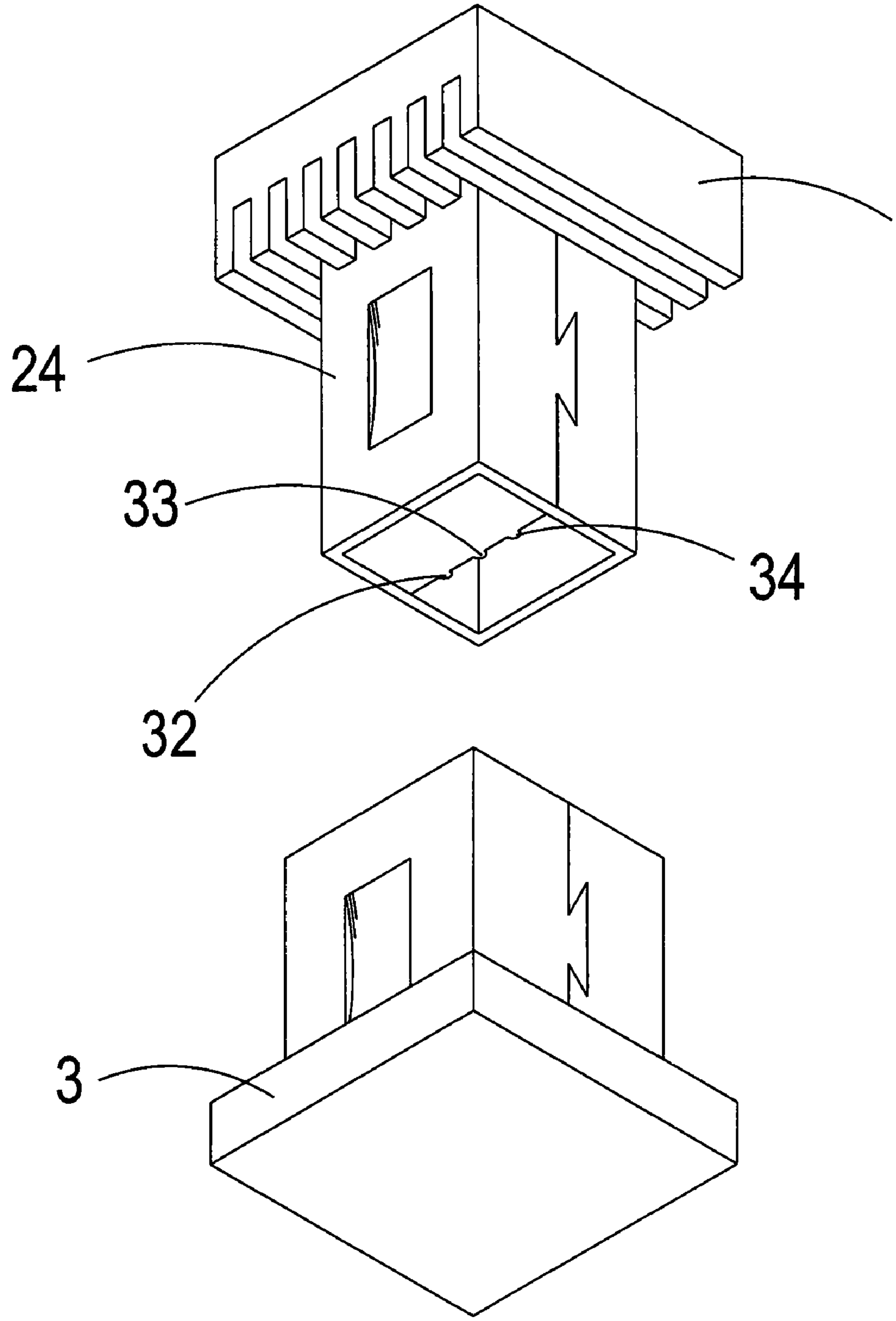
FIG. 7A shows a second exploded view of another preferred embodiment of the present invention.

FIGS. 7 and 7A show a first exploded view and a second exploded view, respectively, of another preferred embodiment of the present invention. As shown in the drawings, the base 21 of the LED assembly 1 can be configured as a heat dissipating device, the first coupling unit 24 and the second coupling unit 3 can be provided respectively with a UPI (Universal Power Interface) and can be installed with a first loop 32, a second loop 33 and a third loop 34, or more number of loops. When the LED 22 can be any combination of red light LED 22, green light LED 22, blue light LED 22, white light LED, ultra-violet LED, or multiple-colored LED, the electric power to the LED 22 can be controlled, in groups or individually, by these individual loops to further control the brightness of the LED to achieve the required light color.

Figure 8:
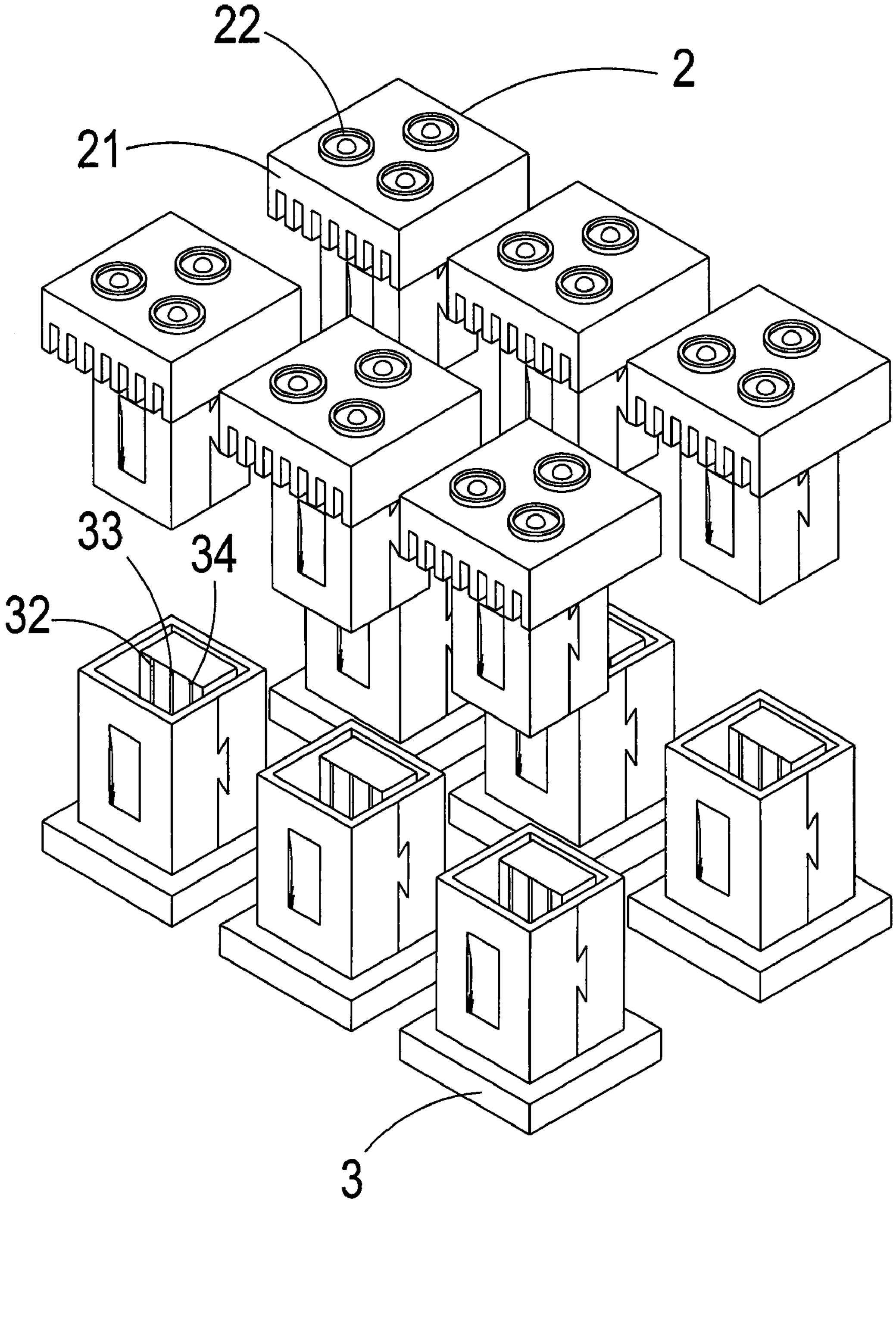
FIG. 8 shows a schematic view of an implementation of another preferred embodiment of the present invention.

FIG. 8 shows a schematic view of an implementation of another preferred embodiment of the present invention. As shown in the drawing, there are more than one second coupling unit 3 for the present embodiment and the second coupling units 3 can be configured as an array. The end user can freely insert the LED unit 2 on the second coupling unit 3 to enhance the lighting at a specific location, increase the number of LED unit 2 to increase the brightness or decrease the number of LED unit 2 to reduce the brightness, at will.

Accordingly, referring to all the drawings, the present invention is actually provided with following advantages in comparison with the prior art.

The first coupling unit 24 of an LED light source can be inserted into the second coupling unit 3. This easy insertion method and easy adaptation of coupling unit 3 by designers and manufacturers allow a degree of freedom in designing luminaries or substitutes of the traditional light sources so that the present invention can be widely used and produced in large quantities. In addition, the second coupling unit 3 can be configured as the array, allowing the user to freely insert the LED unit 2 on the second coupling unit 3, such that the end user can change the position of illumination, determine the number of LED unit 2 and change the brightness, at will.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A multiple circuit power supply interface for light-emitting-diode (LED) color mixing, comprising:

an LED light source unit which includes a base, which comprises a heat dissipation device having heat dissipation fins, and at least one LED which is fixed on the heat dissipation device of the base and each of which is electrically connected with an electricity connection assembly;

a first coupling unit which is assembled integrally with the base and is separate from but electrically connected with the electricity connection assembly; and at least one second coupling unit which corresponds to the first coupling unit, allowing for insertion of the first coupling unit and provides a power source and physical support to the LED;

whereas, the second coupling unit is set up as an array or any spatial configuration required by any luminaries and replacement of traditional light source;

wherein LED may be any combination of red light LED, green light LED, blue light LED, white light LED, ultra-violet LED, and multiple-light LED;

wherein the second coupling unit is electrically connected with at least one controller to control the electric current of each LED to adjust brightness of LED; and wherein the LED, in groups or individually, are provided respectively with an independent circuit loop controlled by independent controller.

2. The multiple circuit power supply interface for LED color mixing, according to claim 1, wherein the electricity connection assembly is an electric wire.

3. The multiple circuit power supply interface for LED color mixing, according to claim 1, wherein the controller is a variable resistor.

* * * * *